United States Patent
Loo et al.

(10) Patent No.: US 10,947,110 B2
(45) Date of Patent: Mar. 16, 2021

(54) MEMS MICROPHONE AND MANUFACTURING METHOD FOR MAKING SAME

(71) Applicant: AAC Technologies Pte. Ltd., Singapore (SG)

(72) Inventors: Lieng Loo, Shenzhen (CN); Shaoquan Wang, Shenzhen (CN); Xiaohui Zhong, Shenzhen (CN); Kahkeen Lai, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 0 days.

(21) Appl. No.: 16/362,836

(22) Filed: Mar. 25, 2019

(65) Prior Publication Data

US 2020/0048080 A1    Feb. 13, 2020

(30) Foreign Application Priority Data

Aug. 7, 2018   (CN) .......................... 201810893332.5

(51) Int. Cl.
*B81C 1/00*     (2006.01)
*B81B 3/00*     (2006.01)
(Continued)

(52) U.S. Cl.
CPC ........ *B81C 1/00619* (2013.01); *B81B 3/0078* (2013.01); *H04R 19/005* (2013.01);
(Continued)

(58) Field of Classification Search
CPC ......... B81C 1/00619; B81C 2201/0112; B81C 2201/0114; B81C 2201/0142;
(Continued)

(56) References Cited

U.S. PATENT DOCUMENTS

| | | | |
|---|---|---|---|
| 6,759,340 B2 * | 7/2004 | Nallan | H01L 21/30655 438/714 |
| 7,351,643 B2 * | 4/2008 | Nagao | H01L 21/31116 438/424 |

(Continued)

FOREIGN PATENT DOCUMENTS

| | | |
|---|---|---|
| CN | 105374737 A | 3/2016 |
| CN | 106206511 A | 12/2016 |

OTHER PUBLICATIONS

1st Office Action dated Mar 4, 2020 by CNIPA in related Chinese Patent Application No. 201810893332.5 (7 Pages).

*Primary Examiner* — Fan S Tsang
*Assistant Examiner* — Angelica M McKinney
(74) *Attorney, Agent, or Firm* — IPro, PLLC; Na Xu

(57) ABSTRACT

The present invention provides a manufacturing method for MEMS structure. The method includes steps of: S1: providing a substrate, including a structural layer and a silicon-based layer overlapped with the structural layer; S2: carrying out a main etching process for etching out a cavity hole from an end of the silicon-based layer, which is far away from the structural layer, in a direction toward the structural layer until the cavity hole contacts the structural layer; and S3: carrying out an over-etching process for deepening the cavity hole and control an included angle α between a side wall of the cavity hole and the structural layer to be larger than 10° but smaller than 90°. The invention also provides a MEMS structural and a MEMS microphone manufactured by the method.

3 Claims, 4 Drawing Sheets

(51) Int. Cl.
*H04R 19/00* (2006.01)
*H04R 19/04* (2006.01)

(52) U.S. Cl.
CPC ...... *H04R 19/04* (2013.01); *B81B 2201/0257* (2013.01); *B81B 2203/0315* (2013.01); *B81C 2201/0112* (2013.01); *B81C 2201/0142* (2013.01); *H04R 2201/003* (2013.01)

(58) Field of Classification Search
CPC .......... B81B 3/0078; B81B 2201/0257; B81B 2203/0315; B81B 2203/0353; H04R 19/005; H04R 19/016; H04R 19/04; H04R 19/01; H04R 2201/00
See application file for complete search history.

(56) References Cited

U.S. PATENT DOCUMENTS

| | | | | |
|---|---|---|---|---|
| 9,224,615 | B2* | 12/2015 | Chang | H01L 21/3065 |
| 9,412,566 | B2* | 8/2016 | McNie | H01L 21/30655 |
| 10,741,490 | B2* | 8/2020 | Chen | H01L 25/105 |
| 2004/0097077 | A1* | 5/2004 | Nallan | B81C 1/00619 |
| | | | | 438/689 |
| 2004/0232106 | A1* | 11/2004 | Oka | B81C 1/00619 |
| | | | | 216/26 |
| 2005/0170607 | A1* | 8/2005 | Hirohama | H01L 21/76232 |
| | | | | 438/424 |
| 2006/0231521 | A1* | 10/2006 | Chilcott | B81B 3/0072 |
| | | | | 216/2 |
| 2007/0077727 | A1* | 4/2007 | Huang | B81C 1/00587 |
| | | | | 438/444 |
| 2007/0098344 | A1* | 5/2007 | Judong | B81C 1/00103 |
| | | | | 385/123 |
| 2008/0121042 | A1* | 5/2008 | Miller | G01H 3/04 |
| | | | | 73/649 |
| 2009/0180647 | A1* | 7/2009 | Chen | B81B 3/0078 |
| | | | | 381/174 |
| 2009/0242512 | A1* | 10/2009 | Beaudry | H01L 21/30655 |
| | | | | 216/49 |
| 2013/0313661 | A1* | 11/2013 | Grille | H04R 19/005 |
| | | | | 257/416 |
| 2015/0024605 | A1* | 1/2015 | Minami | B81C 1/00087 |
| | | | | 438/712 |
| 2015/0341726 | A1* | 11/2015 | Friza | H04R 31/00 |
| | | | | 257/416 |
| 2016/0376147 | A1* | 12/2016 | Gandelhman | G04B 13/02 |
| | | | | 368/139 |
| 2018/0277395 | A1* | 9/2018 | Masukawa | H01L 23/12 |

\* cited by examiner

MEMS MICROPHONE AND MANUFACTURING METHOD FOR MAKING SAME

FIELD OF THE PRESENT DISCLOSURE

The invention relates to the technical field of the manufacturing of silicon microphones, particularly to a manufacturing method of MEMS structure, MEMS structure, and a silicon microphone.

DESCRIPTION OF RELATED ART

Bosch process is a deep silicon etching process which repeats isotropic etching cycles and then deposits a protection film. Generally, SF6 plasma etching silicon and a C4F8 plasma deposition protection layer are used. The Bosch process and the deposition protection layer are used. The wall of etched silicon generates a fan shape. For industry, the silicon etching rate is slow; thus, the volume is limited when deeply etch Si. To get a higher yield, the method is designed to try best to etch as fast as possible but doesn't concern the fan shape and size, however, the fan shape, particularly, the fan shape which contacts a structure layer influences the result of the test of a mechanical stability structure.

BRIEF DESCRIPTION OF THE DRAWINGS

Many aspects of the exemplary embodiments can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENTS

The present disclosure is hereinafter described in detail with reference to several exemplary embodiments. To make the technical problems to be solved, technical solutions and beneficial effects of the present disclosure more apparent, the present disclosure is described in further detail together with the figure and the embodiments. It should be understood the specific embodiments described hereby is only to explain the disclosure, not intended to limit the disclosure.

Figure 1:
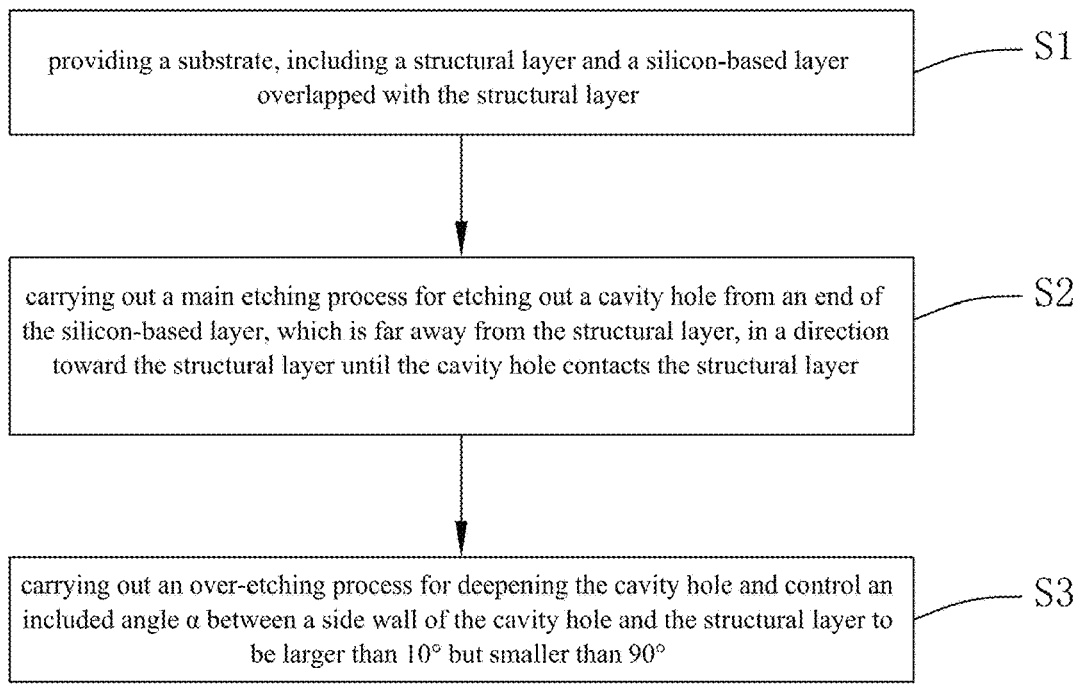
FIG. 1 is a flow chart of a method for manufacturing a MEMS microphone in accordance with an exemplary embodiment of the present invention.
Figure 2:
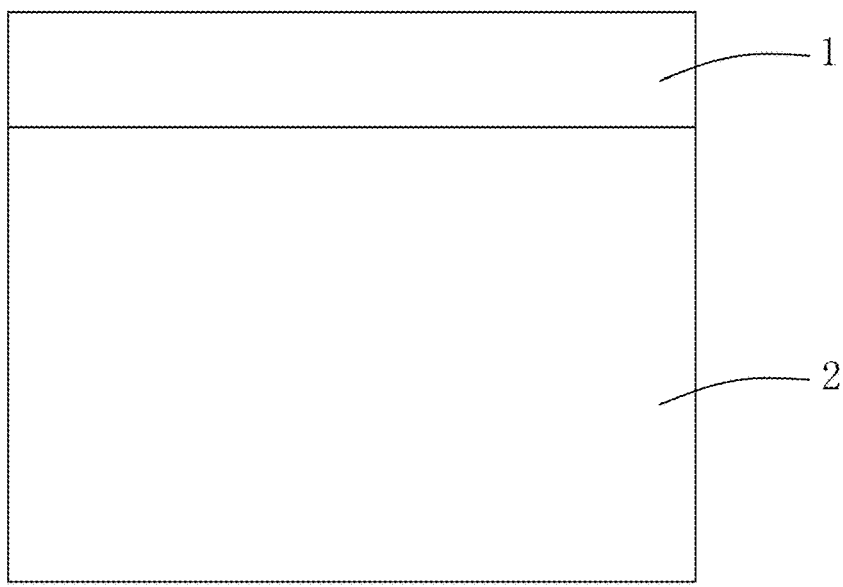
FIG. 2 is an illustration of a substrate of the MEMS microphone in the exemplary embodiment.

Referring to FIG. 1, an embodiment of the invention provides a manufacturing method for a MEMS structure, which comprises of the following steps:

S1. Provide a substrate, including a structural layer 1 and a silicon-based layer 2 overlapped with the structural layer 1 (as shown in FIG. 2).

Wherein, the structural layer 1 can be made from silicon, nitride, polysilicon and other materials.

Figure 3:
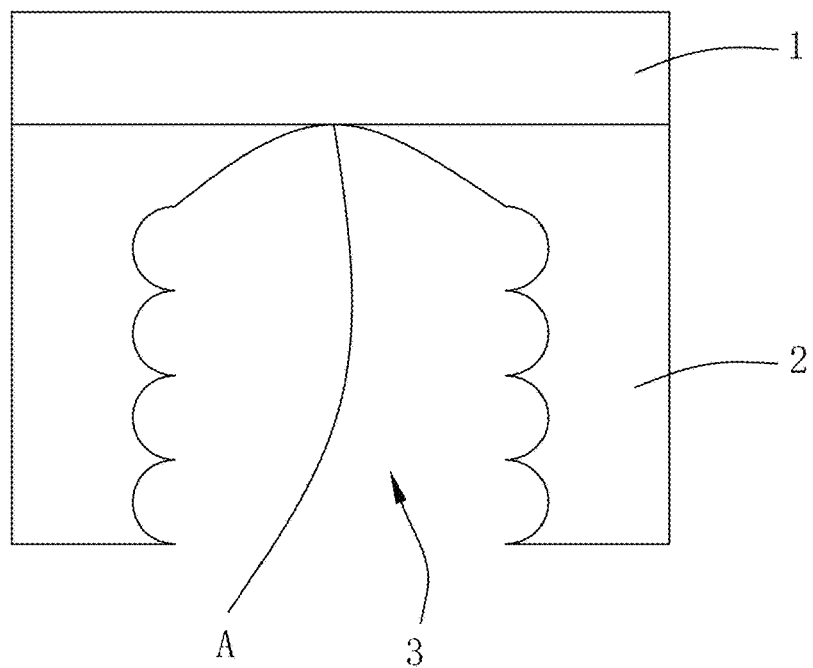
FIG. 3 is an illustration of the substrate after a main etching process.

S2. Carry out a main etching process. Etch out a cavity hole 3 from the end of the silicon-based layer 2, which is far away from the structural layer 1, in the direction to the structural layer 1 until the cavity hole 3 contacts the structural layer 1, as shown in FIG. 3.

Wherein, once the deepest part A of the cavity hole 3 contacts the structural layer 1, the main etching process ends.

Figure 4:
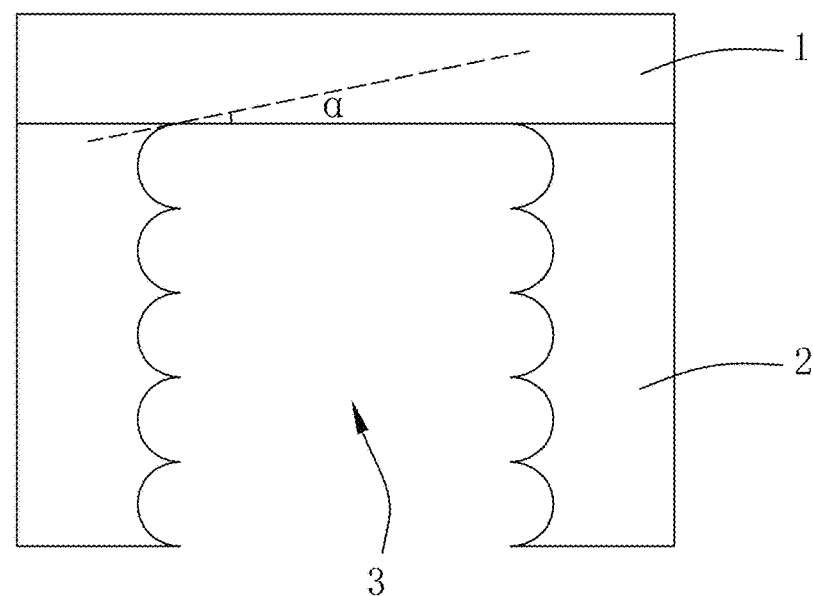
FIG. 4 is an illustration of the substrate after an etching process.

S3. Carry out an over-etching process. Deepen the cavity hole 3 and control an included angle α between a side wall of the cavity hole 3 and the structural layer 1 to be larger than 10° but smaller than 90°, as shown in FIG. 4.

In the invention, the cavity hole 3 is deeper than 100 μm.

The included angle α between the cavity hole 3 and the structural layer 1 can be controlled by controlling the etching rate, etc, in the over-etching process.

Both of S2 and S3 use Bosch process for etching. Of course, the Bosch process is not necessary. However, the Bosch process is preferred in the preferred embodiments of the invention so as to both get high verticality of the side wall and ensure the etching rate.

It should be noted that in S2, the main etching process includes the circulation operation of etching and deposition of a protection layer. In S3, the over-etching process also includes the circulation operation of etching and deposition of the protection layer.

Figure 5A:
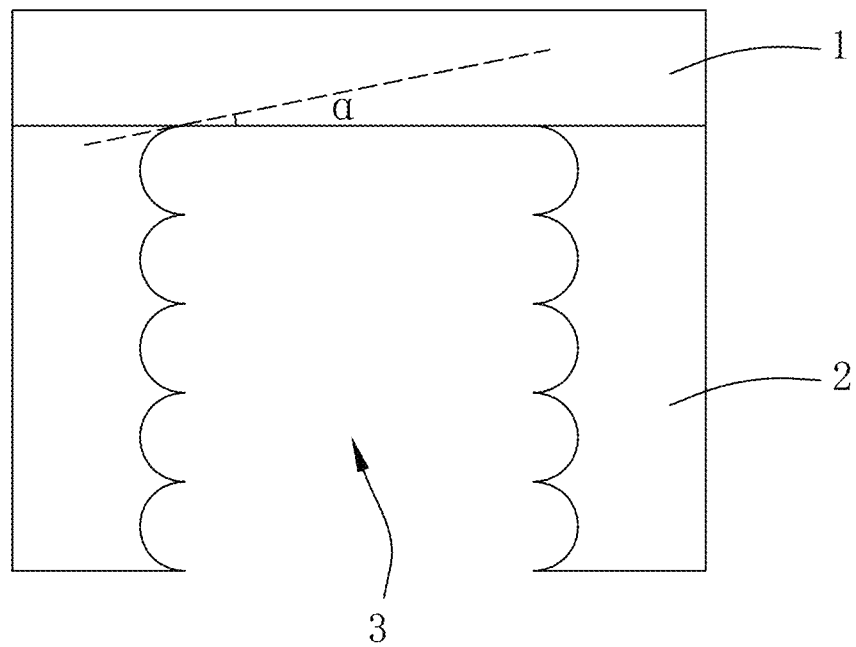
FIG. 5(a) is an illustration of a MEMS structure of the MEMS microphone.
Figure 5B:
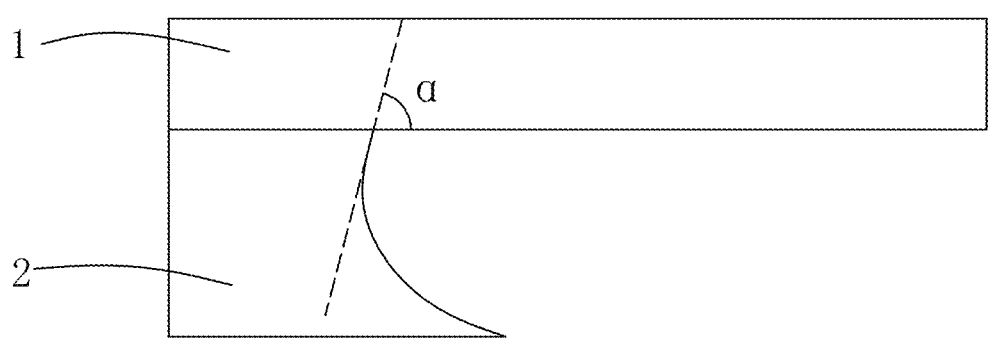
FIG. 5(b) is another illustration of the MEMS structure of the MEMS microphone.

As shown in FIG. 5, the invention also provides a MEMS structure 100 which comprises of a structural layer 1 and a silicon-based layer 2, wherein, the silicon-based layer 2 is provided with the cavity hole 3 which penetrates the silicon-based layer 2. The cavity hole 3 is deeper than 100 μm. The included angle α between the cavity hole 3 and the structural layer 1 is larger than 10° but smaller than 90°. It has to explain that the cavity hole is a closed hole with a closed side wall, as shown in FIG. 5(a). The cavity hole 3 can also be a non-closed hole of which the side wall is not closed, as shown in FIG. 5(b). Wherein, FIG. 5(a) shows the specific structure of the MEMS structure 100 when the included angle is close to 10°, and FIG. 5(b) shows the specific structure of the MEMS structure 100 when the included angle is close to 90°. When the included angle is between 10° to 90°, the MEMS structure 100 has high reliability.

It has to explain that the included angle α above is the included angle between the plane where the structural layer 1 is and the tangent line of the side wall of the intersection of the structural layer 1 and the cavity hole 3.

Figure 6:
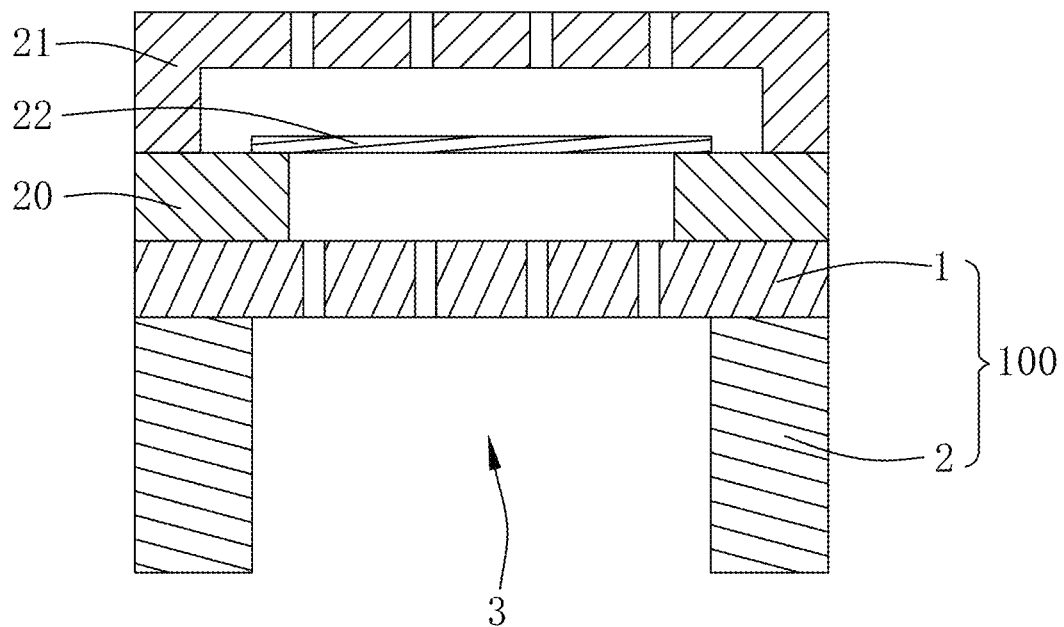
FIG. 6 is an illustration of the MEMS microphone.

Please refer to FIG. 6; the invention also provides a silicon microphone 200 which uses the MEMS structure 100. When the MEMS structure 100 is applied in the silicon microphone, the structural layer 1 can be used as a back plate or a diaphragm. In the specific embodiments provided by the invention, the structural layer 1 is used as a first back plate, the silicon microphone 200 also comprises of an insulation layer 20 arranged on the structural layer 1, a second back plate 21 arranged on the insulation layer 20 and a diaphragm 22 included between the second back plate 21 and the insulation layer 20.

Compared with the prior art, the manufacturing method of MEMS structure, the MEMS structure and the silicon microphone which are provided by the invention have the following advantage: the structural reliability of the microphone is effectively improved by controlling the included angle between the side wall of the cavity hole and the structural layer to be larger than 10° but smaller than 90°.

One of ordinary skill in the art understands that the above embodiments are specific embodiments for the realization of the present invention, and in practical applications, various changes can be made to them in form and detail without deviating from the spirit and scope of the invention.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A manufacturing method for MEMS structure, comprising following steps:
    S1: providing a substrate, including a structural layer and a silicon-based layer overlapped with the structural layer;
    S2: carrying out a main etching process for etching out a cavity hole from an end of the silicon-based layer, which is far away from the structural layer, in a direction toward the structural layer until the cavity hole contacts the structural layer; and
    S3: carrying out an over-etching process for deepening the cavity hole and control an included angle $\alpha$ between a side wall of the cavity hole and the structural layer to be larger than 10° but smaller than 90°; the angle $\alpha$ is between a plane where the structural layer is and a tangent line of the side wall of an intersection of the structural layer and the cavity hole; the angle $\alpha$ faces the cavity hole and is right on a side of the plane close to the structure layer.

2. The manufacturing method for MEMS structure as described in claim 1, wherein the cavity hole is deeper than 100 μm.

3. The manufacturing method for MEMS structure as described in claim 1, wherein both of S2 and S3 use Bosch process for etching.

* * * * *